(12) United States Patent
Calabrese et al.

(10) Patent No.: US 7,020,583 B2
(45) Date of Patent: Mar. 28, 2006

(54) METHOD AND APPARATUS FOR DETERMINING CHEMISTRY OF PART'S RESIDUAL CONTAMINATION

(75) Inventors: Paula Calabrese, Mendon, VT (US); Andrej Mitrovic, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 14 days.

(21) Appl. No.: 10/767,346

(22) Filed: Jan. 30, 2004

(65) Prior Publication Data

US 2005/0171702 A1    Aug. 4, 2005

(51) Int. Cl.
*H01L 21/66* (2006.01)

(52) U.S. Cl. .......................... 702/187; 438/14
(58) Field of Classification Search .................. 438/14; 702/187, 188, 22–24, 34, 81
See application file for complete search history.

(56) References Cited

U.S. PATENT DOCUMENTS

| | | | |
|---|---|---|---|
| 5,457,447 A | 10/1995 | Ghaem et al. | |
| 5,495,250 A | 2/1996 | Ghaem et al. | |
| 6,185,513 B1* | 2/2001 | Plettner et al. | 702/187 |
| 6,691,068 B1* | 2/2004 | Freed et al. | 702/187 |
| 2003/0036885 A1* | 2/2003 | Suermondt et al. | 702/187 |
| 2003/0113943 A1* | 6/2003 | Kishkovich et al. | 438/14 |
| 2004/0040658 A1* | 3/2004 | Usui et al. | 156/345.24 |
| 2005/0107965 A1* | 5/2005 | Kerr et al. | 702/57 |

\* cited by examiner

*Primary Examiner*—Marc S. Hoff
*Assistant Examiner*—Paul Kim
(74) *Attorney, Agent, or Firm*—Oblon, Spivak, McClelland, Maier & Neustadt, P.C.

(57) ABSTRACT

An electronic monitoring device that archives chemical exposures of a consumable part inside a semiconductor processing tool. The monitoring device includes a memory unit dedicated to the consumable part and which stores a history of the chemical exposures of the consumable part, a processor in communication with the memory unit, and a power supply circuit that supplies power to the processor and the memory unit.

34 Claims, 6 Drawing Sheets

METHOD AND APPARATUS FOR DETERMINING CHEMISTRY OF PART'S RESIDUAL CONTAMINATION

BACKGROUND OF THE INVENTION

1. Field of the Invention

This invention relates to the field of semiconductor processing and more particularly to the securing and disposal of consumable parts from a semiconductor processing tool.

2. Description of the Related Art

In the current semiconductor industry practice, many parts of semiconductor processing apparatus are treated as consumable parts either due to wear on the parts or due to the build up of excessively large film deposits which can contribute to particulate contamination of a semiconductor wafer process.

One example of a consumable part in a semiconductor processing apparatus is a free-standing window insert placed on an interior of a vacuum vessel window. The free-standing window insert protects the vacuum vessel window from, for example, deposits which can build on the vacuum window if unprotected. The free-standing window insert over time is replaced once its optical properties become insufficient for diagnostic purposes. By replacing the free-standing window insert, one avoids the time and expense of replacing the vacuum vessel window (a more costly item and one whose installation requires remaking and certifying of the vacuum seal).

Another example of a consumable part in a semiconductor processing apparatus is an electrode cover placed over a capacitive drive electrode in, for example, a reactive ion etcher. The drive electrode in a reactive ion etcher is typically a machined metallic electrode whose surface, if uncovered, is exposed to the reactive ion etch plasma atmosphere especially at high power levels or at edges where the field strength is higher. Such exposure can lead to undesirable metal contamination of the semiconductor wafer being etched. To prevent metal contamination, the drive electrode is provided with a cover made of, for example, silicon or quartz. Over time, the cover can etch or otherwise become unusable requiring that it be replaced. For example, even small changes in the physical dimensions of the cover can influence the resultant plasma uniformity in the reactive ion etcher. Due to the need to maintain plasma uniformity, such covers are changed frequently and become a consumable part whose proper disposal depends on the history of its exposure to aggressive chemistries and toxic substances in the semiconductor processing chamber.

Accordingly, one important environmental, health, and safety (EHS) issue in the semiconductor industry becomes that of disposal of used consumable parts from semiconductor processing tools. These parts are frequently exposed to toxic and dangerous chemistries during the lifetime of the consumable parts on the tool. The consumable parts need to be disposed of in a safe fashion and according to all applicable regulations. The chemicals that the consumable parts may have been exposed include extremely toxic materials such as for example hydrogen-fluoride (HF), arsine ($AsH_3$), nitrogen-fluoride ($NF_3$), etc. The disposal method depends on the chemicals that the part has been exposed to. In an environment where different wafer batches are subjected to different processes on the same tool, such as in a foundry semiconductor manufacturing plant, it is difficult to track what chemistries have been used in the tool since the consumable part was last replaced. Furthermore, it is typical that when maintenance on the tool is performed, there is no knowledge of the chemistries that the consumable parts have been exposed to, leading in some cases to the use of the safest, and invariably most expensive disposal approach. Such a fail-safe approach raises the cost of semiconductor processing.

SUMMARY OF THE INVENTION

To address proper environmental disposal of consumable parts, the present invention provides a novel device and method that permits fab maintenance, EHS, and disposal personnel to ascertain the history of chemistries that a consumable part has been exposed to during its lifetime in the semiconductor processing system, thereby permitting appropriate disposal methods to be used.

Accordingly, one object of the present invention is to provide a monitoring device to monitor the chemical history that a consumable part has been exposed to.

Still a further object of the present invention is to provide the monitoring device with a capability to record the chemical history (i.e. the processing history) that the consumable part is exposed to.

Another object of the present invention is to provide such a monitoring device on the consumable part itself.

Yet, another object of the present invention is to provide a monitoring device configured to transfer the recorded history either while the consumable part is in the processing chamber or once the consumable part has been removed, or both.

Thus, according to one aspect of the present invention, there is provided a novel electronic monitoring device for archiving chemical exposures of a consumable part inside a semiconductor processing tool. The electronic monitoring device includes a memory unit dedicated to the consumable part and configured to store a history of the chemical exposures of the consumable part, a processor connected to the memory unit and configured to be in communication with the memory unit, and a power supply circuit configured to supply power to the memory unit and the processor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EXEMPLARY EMBODIMENTS

Figure 1:
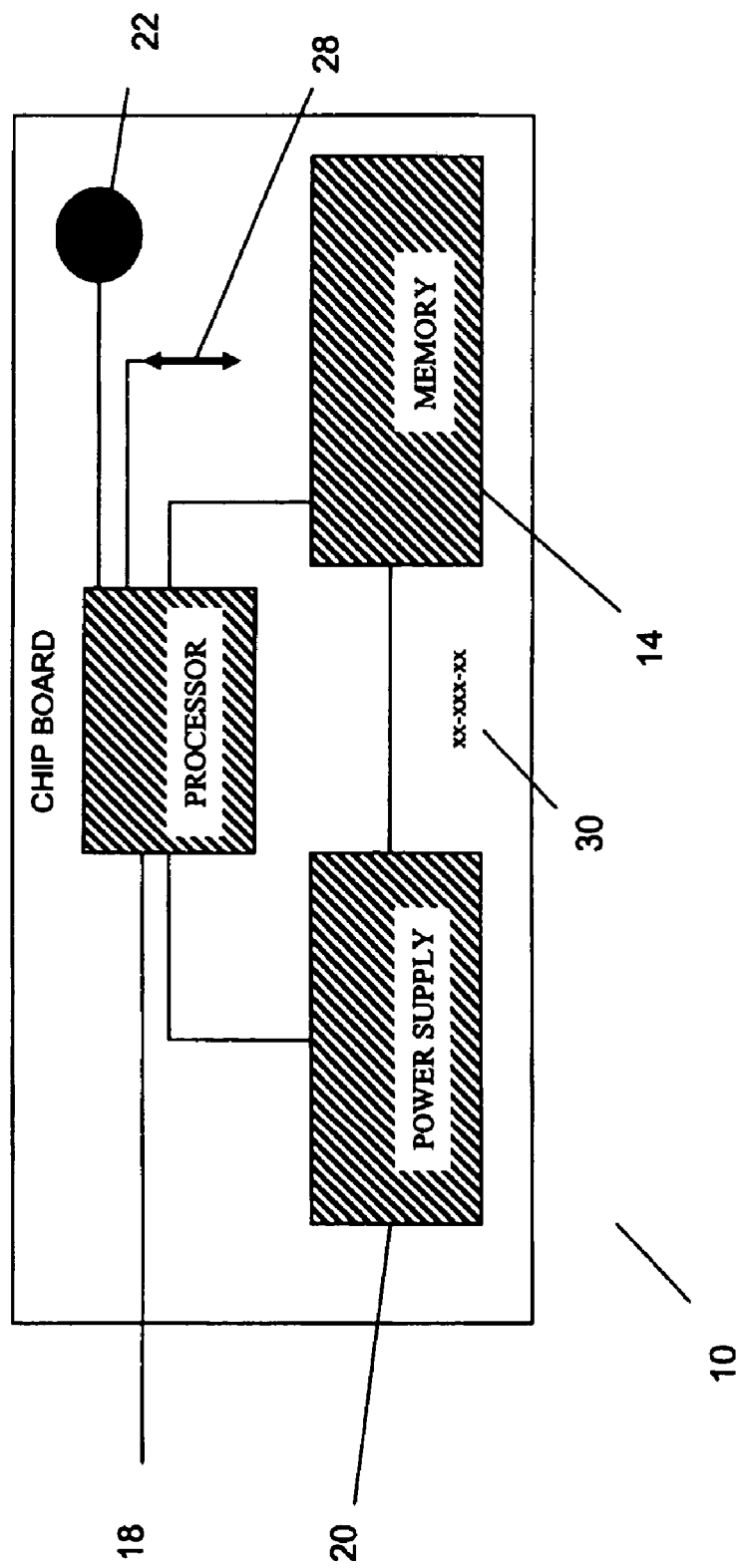
FIG. 1 is a schematic illustration of an electronic monitoring device of the present invention.

Referring now to the drawings, FIG. 1 depicts a schematic view of an electronic monitoring device 10 in accordance with one embodiment of the present invention utilized in a semiconductor processing system 12.

The electronic monitoring device 10 includes a memory 14 dedicated to the consumable part 16 (shown in FIG. 2), which stores a history of chemical exposures of the consumable part 16. The electronic monitoring device 10 includes an electronic monitoring device processor 18 connected to the memory 14, and includes a power supply circuit 20 for providing power to the memory 14 and the processor 18. The memory 14 of the electronic monitoring device 10 is preferably a nonvolatile memory, such as FLASH memory. The power supply circuit 20 can include a power source such as a battery (not shown). The electronic monitoring device 10 can include a gas sensor 22. The processor 18 can transfer data to and from the tool controls 26 (shown in FIG. 2) via a wireless communication system that is part of processor 18, and an antenna 28.

Figure 2:
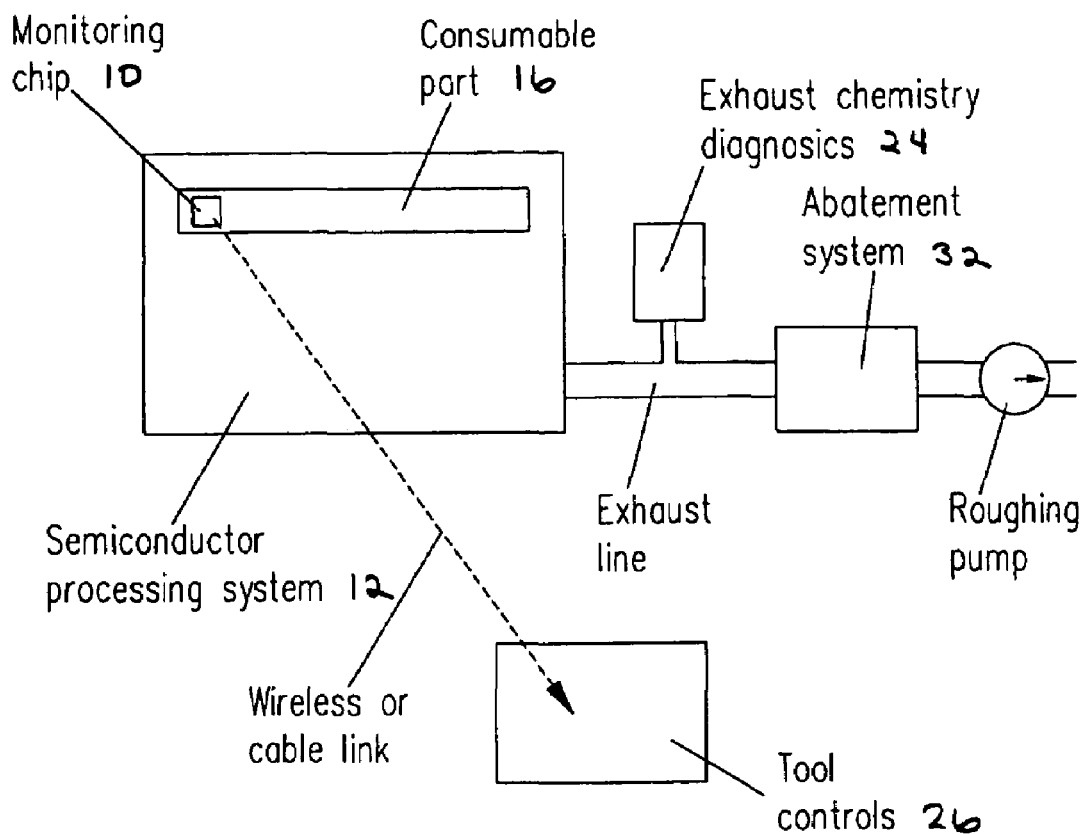
FIG. 2 is a schematic illustration of a placement of the electronic monitoring device of the present invention in a semiconductor processing system.

As shown in FIG. 2, the electronic monitoring device 10 can be embedded inside the consumable part 16. During the process lifetime of the consumable part 16, the memory 14 stores data about chemistries to which the consumable part 16 has been exposed to, provided either by the sensor 22 on the consumable part 16, or provided from an external tool-mounted sensor 24 on the semiconductor processing tool 12. The location of the tool-mounted sensor 12 is shown on the tool exhaust line. However, it may also be installed in other locations, such as directly on the processing chamber, or in the gas supply system that supplies processing gases to the chamber. In one embodiment of the present invention, the stored data in the electronic monitoring device 10 can be read once the consumable part 16 has been removed from the tool 14, to facilitate the use of the most appropriate disposal method. According to one embodiment of the present invention, the data stored in the electronic monitoring device 10 can be recorded from process run data accessed from a tool controller 26 of the semiconductor processing tool 12. The data recorded archives the chemistries that the consumable part 16 has been exposed to. Accordingly, this data is made available to disposal personnel, and can be supplied without sharing proprietary semiconductor processing tool data such as for example run-time operation conditions. Embedding the electronic monitoring device 10 containing the archived data in the consumable part 16 ensures that the data is accessible to everyone that handles the consumable part 16 and who is authorized to access the archived data.

Power and communication to the electronic monitoring device 10 may be provided by an antenna 28, shown in FIG. 1, which can receive RF energy from, for example, the rf power supplied to the semiconductor processing system 12 to maintain a plasma in the semiconductor processing system 12, thereby eliminating the need for an independent power source. An ac-dc power converter (inside the processor) converts the rf energy into dc power, thereby powering the device while the plasma process is on and/or optionally recharging a battery included in the electronic monitoring device. Further, the antenna 28 can be configured to provide the afore-mentioned wireless communication to the outside world. Indeed, the electronic monitoring device 10 can employ a configuration, method of communicating, and a system for supplying power to the device wirelessly very similar to that disclosed in U.S. Pat. No. 5,457,447, "Portable power source and RF tag utilizing the same", the entire contents of which are incorporated herein by reference; in a semiconductor processing tool, one can use RF energy present inside the tool to power the device. A similar, but battery-powered device is disclosed in U.S. Pat. No. 5,495,250 "Battery-powered RF tags and apparatus for manufacturing the same", also included herein by reference in its entirety.

Figure 3:
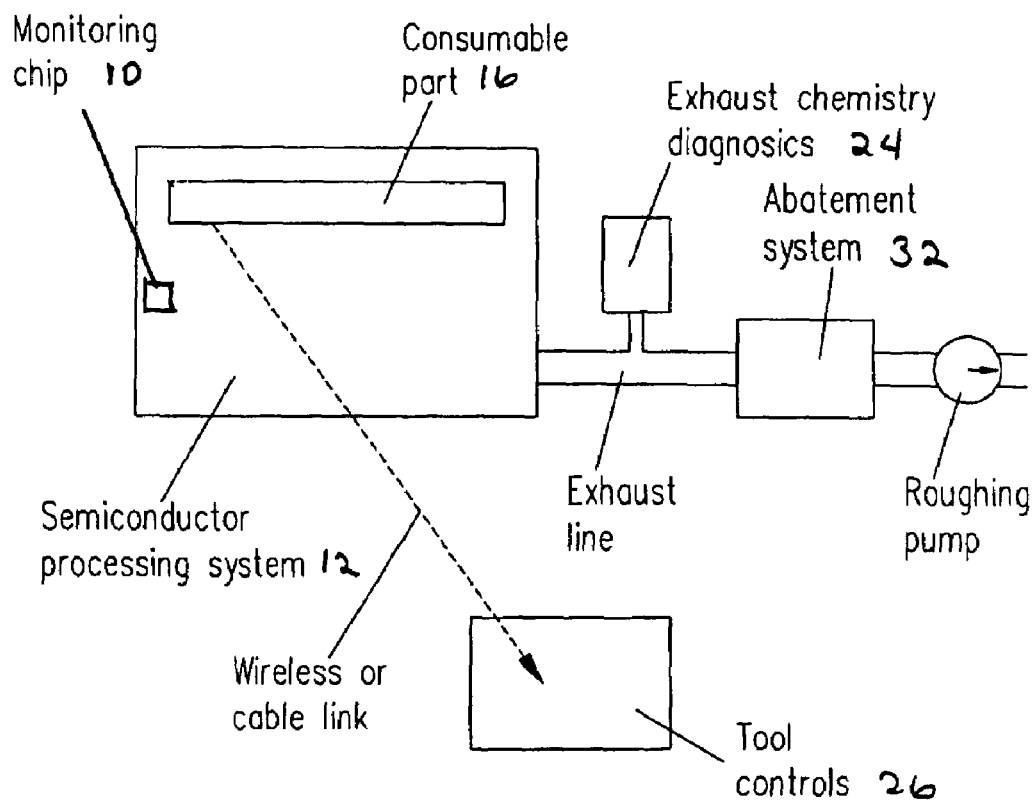
FIG. 3 is a schematic illustration of another placement of the electronic monitoring device of the present invention in a semiconductor processing system.

In one embodiment of the present invention, as shown in FIG. 3, the electronic monitoring device 10 can be dedicated to the consumable part 16, but detached from the consumable part 16 and located within the semiconductor processing system 12. This embodiment of the invention is particularly applicable to consumable parts that a monitoring device cannot be easily embedded into due to the size of the consumable part, for example. The position where the electronic monitoring device 10 is located is selected to be representative of the gas chemistries that the consumable part 16 is exposed to and/or based on convenience of service when the consumable part 16 is removed. The position where the electronic monitoring device 10 is disposed can also be selected based on the longevity of the electronic monitoring device 10 itself, as direct attachment to the consumable part 16 may expose the electronic monitoring device 10 to extreme temperatures inside the semiconductor processing system 12. Correspondingly, the electronic monitoring device 10 in one embodiment can be placed remote from high temperature regions inside the semiconductor processing system 12. The electronic monitoring device 10 separated from the consumable part is preferably identified with a mark that associates the device with its respective part. When the consumable part is removed, the device 10 having the part history stored therein, can be removed and handled with the part to provide the stored history, as with the embedded embodiment above.

As noted above, in one embodiment of the present invention, the electronic monitoring device 10 is configured to transfer data wirelessly (i.e. via a wireless link), eliminating the need for any additional infrastructure to be added to the semiconductor processing system 12 (i.e., without the need to add for example communication cables, contacts, etc.) The wireless transfer capability allows the electronic monitoring device 10 of the present invention to be used as a retrofit in existing semiconductor processing tools. For example, the electronic monitoring device 10 may be provided as a discrete component having an attaching feature that allows the device 10 to be attached to the consumable part itself or an object internal or external to the semiconductor processing system. The attaching feature may be a fastener such as a threaded stud that is screwed into an object, an adhesive, or any other attaching feature known to one of ordinary skill in the art. Accordingly, in this embodiment, the electronic monitoring device 10 of the present invention does not require alteration of existing equipment configurations.

Alternatively, without wireless communications, the electronic monitoring device 10 would communicate via wires between for example the consumable part 16 and the tool controller 26. These same lines can be used to power the electronic monitoring device 10. Due to high RF fields present in a semiconductor processing system, wires are susceptible to inductive pickup from these fields, creating interference with the transmitted signals. To alleviate this problem, in at least one embodiment, it is possible to replace wires with an optical fiber, and power the device by sending light energy through the fiber, to the device, where it is converted into electrical power. The same optical fiber can be used to transmit data to the tool controller 26.

Figure 4:
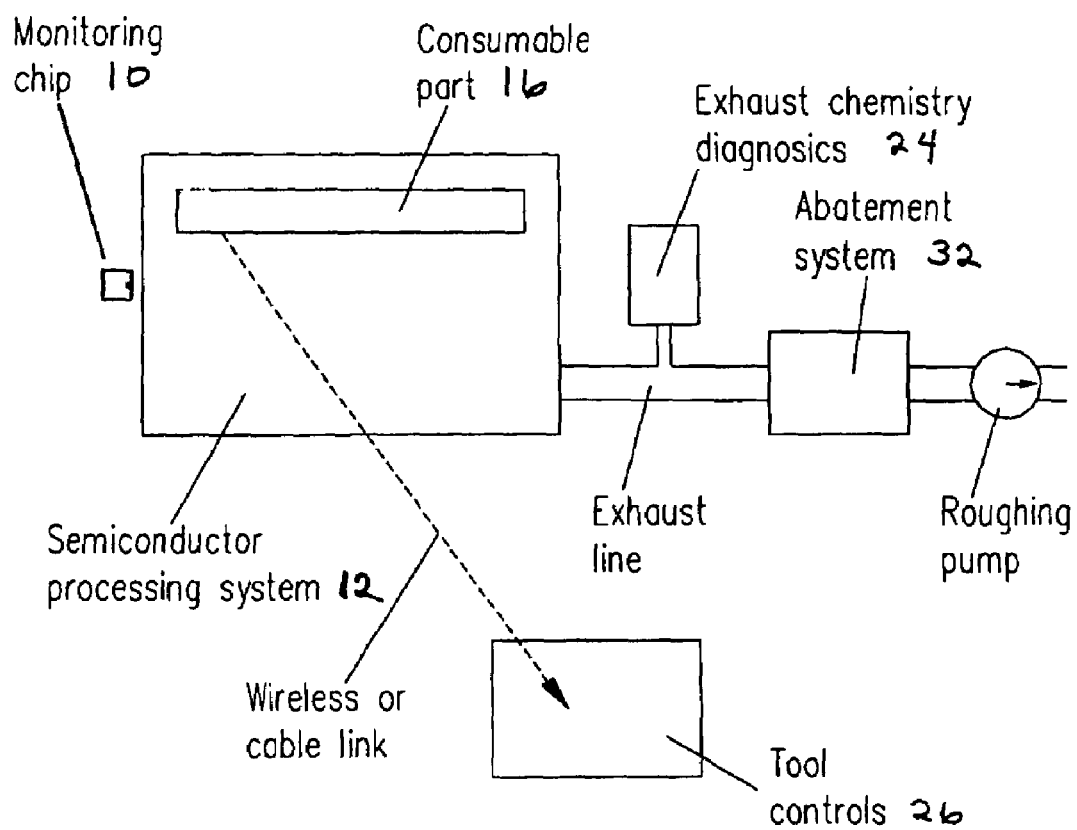
FIG. 4 is a schematic illustration of still another placement of the electronic monitoring device of the present invention outside a semiconductor processing system.

In another embodiment of the present invention, as shown in FIG. 4, the electronic monitoring device 10 is located outside the semiconductor processing system 12. In this embodiment, an electronic monitoring device 10 is dedicated for each consumable part 16 and is placed outside the system 12 and tagged with an identification number 30, associating the electronic monitoring device 10 with its respective consumable part 16 in the semiconductor processing system 12. Disposal personnel can evaluate the chemical exposure of the consumable part before removing the consumable part from the semiconductor processing system 12. Upon removal of the consumable part 16 from the semiconductor processing system 12, the appropriate one of the electronic monitoring devices associated with the consumable part removed can be attached to the consumable part.

According to the present invention, data is provided to the electronic monitoring device 10 of the present invention by either on-consumable-part gas sensors (i.e. gas sensor 22) or from external sources, such as the exhaust chemistry diagnostics 24 on the semiconductor processing system 12. The data is stored as noted above preferably in a non-volatile memory chip on the electronic monitoring device 10 although volatile memory devices (as discussed below) can be utilized. Once the consumable part 12 is removed from the tool, the stored data can be read using similar communication techniques discussed above (e.g. wireless or by wire or optical fiber). The data provides to maintenance, EHS, and disposal personnel the chemical history information, based on which the most appropriate method of consumable part disposal can be decided. A secure communication can be established in which only authorized personnel can read the electronic monitoring device 10, such as for example by providing a password that enables the data transfer thus avoiding the electronic monitoring device becoming a source of confidential process information about process chemistries run in a semiconductor fabrication line. Further, security features can include provisions for deleting the data on the electronic monitoring device 10 once the data is no longer needed. For example, unnecessary data on the electronic monitoring device 10 can be examined and deleted before the electronic monitoring device is handed over to disposal personnel. Alternatively, if the electronic monitoring device 10 is remote from the consumable part 16, once the archived data is downloaded for purposes of informing the disposal personnel of the chemical history of the consumable part being disposed of, the memory 14 of the electronic monitoring device 10 can be erased if the memory 14 utilizes a volatile memory, or an erasable non-volatile memory, such as FLASH memory. In another embodiment of the present invention, the processor 18 on the electronic monitoring device 10 can be programmed to store only specific, non-confidential process information in the memory 14 of the electronic monitoring device 10.

As noted above, when there are no gas sensors on the electronic monitoring device 10, the tool controller 26 can download process chemistry recipe data to the electronic monitoring device, or the tool controller 26 can download actual readings of chemical species concentrations measured by the exhaust chemistry diagnostics 24 of the semiconductor processing system 12. For example, data taken by a residual gas analyzer or infrared spectroscopy system of semiconductor processing system 12 can be stored in memory 14 of the electronic monitoring device 10. These readings are preferably taken before exhaust gasses from the semiconductor processing system 12 pass through an abatement system 32, to ensure that the data recorded accurately reflects the chemical history that the consumable part 16 was exposed to.

By storing both the recipe data and the measured data, comparisons of data between different runs can be made to identify episodes of higher contamination due to a malfunctioning gas supply system, etc. Parts that have been subjected to excessive contamination due to system malfunctions can be then disposed of more carefully than if the processes ran according to recipe. By having gas sensors 22 on the electronic monitoring devices 10 of the present invention, a third data trace can be added, providing redundancy to the measured data downloaded from the tool controller 26.

Figure 5:
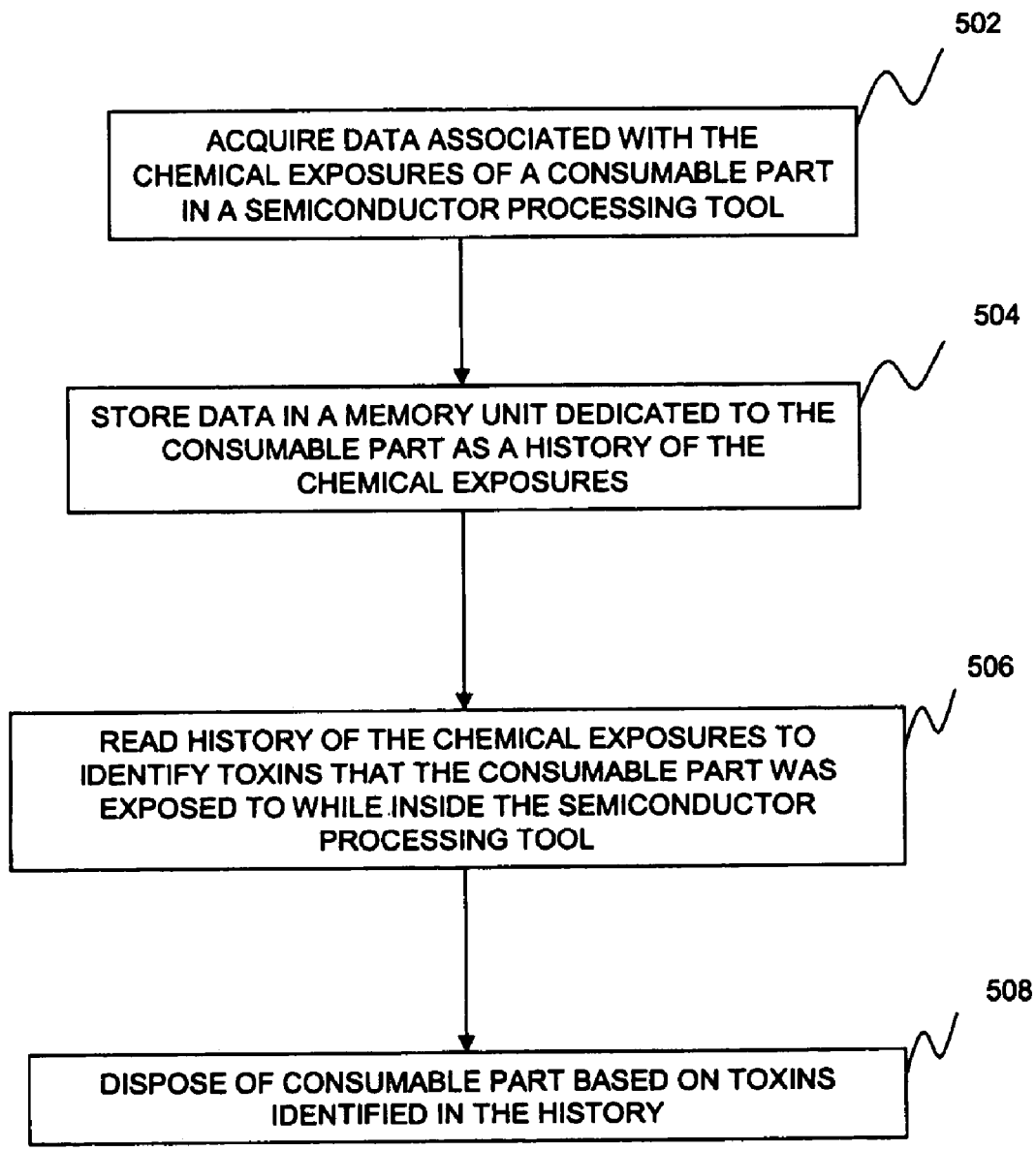
FIG. 5 is an illustrative flowchart depicting a method of the present invention.

Accordingly, one embodiment of the present invention relates to a method for disposing of a consumable part from a semiconductor processing tool. The steps of this method are illustrated in FIG. 5. In step 502, data associated with chemical exposures of the consumable part while inside the semiconductor processing tool is acquired. In step 504, the data is stored in a memory unit dedicated to the consumable part as a history of the chemical exposures of the consumable part. In step 506, the history of the chemical exposures is read to identify toxins that the consumable part was exposed to while inside the semiconductor processing tool. In step 508, the consumable part is disposed of, based on the toxins identified from the history.

In step 502, data can be acquired from a gas sensor configured to sense the gaseous environment near the consumable part. The gas sensor may be attached to or detached from the consumable part. The gas sensor can be connected to the semiconductor processing tool. In this case, gas sensor data and/or process run data can be transmitted (wirelessly or by wire or optical fiber) from the semiconductor processing tool to the memory unit dedicated to the consumable part. Alternatively, the memory unit can acquire process run data from the semiconductor processing tool controller (e.g. recipe data). Process proprietary data can be discriminated and removed from the process run data such that non-confidential data is stored as the history of the chemical exposures only, in the memory unit.

Step 504 of storing data stores data preferably in a non-volatile memory unit. However, as noted below in explanation of the electronic monitoring device processor 18, the data can be stored in volatile memory units as well.

In step 506 of reading the history, the history can be read from the memory unit after password confirmation, thus preventing unauthorized reading of the data. Upon authorization, the history can be transmitted from the memory unit wirelessly or by wire to a recipient, such as for example safety or disposal personnel.

Figure 6:
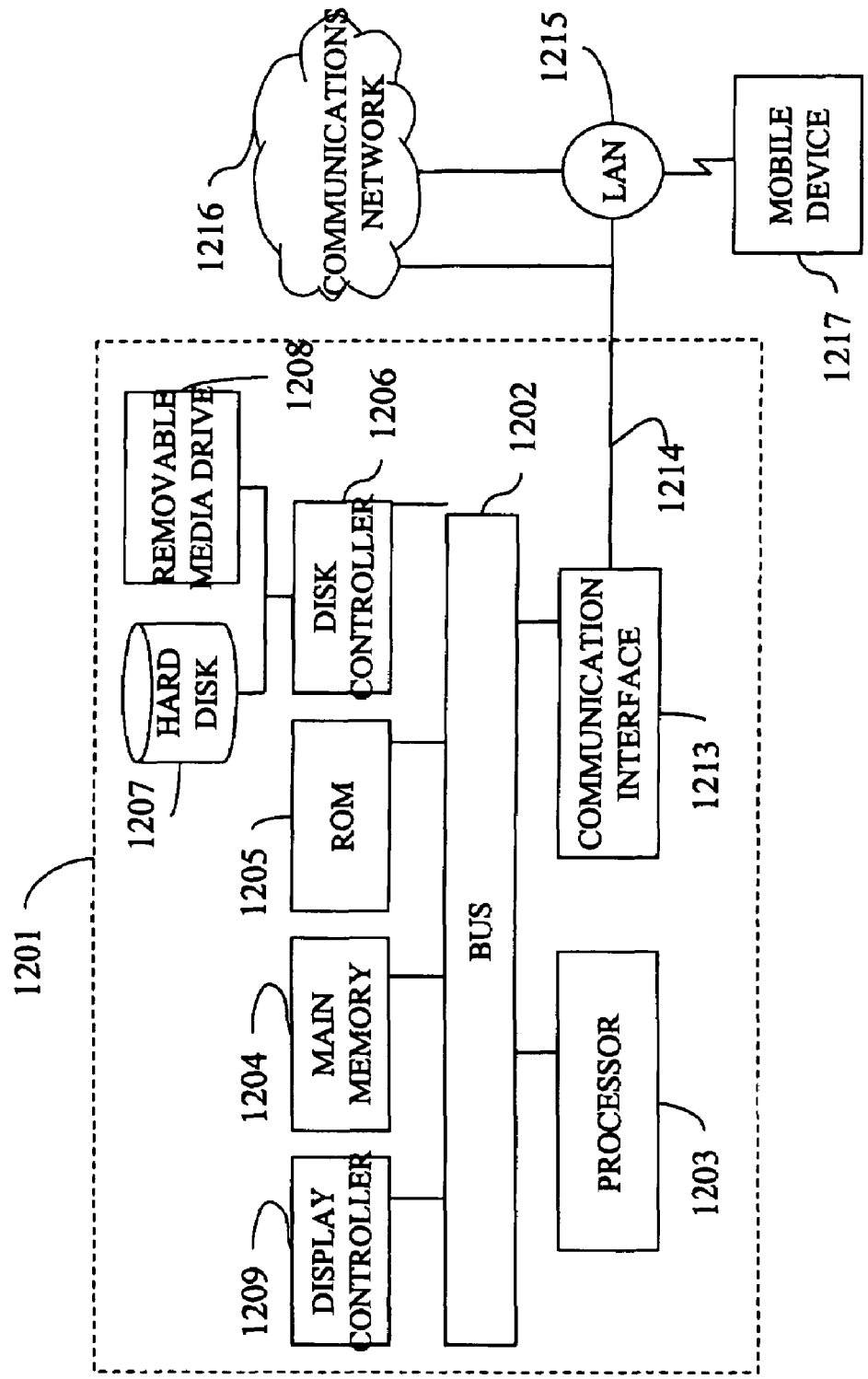
FIG. 6 illustrates one embodiment of a computer system which may be used to facilitate functions of the processor, and/or data readout and interpretation system, of the present invention.

FIG. 6 illustrates one embodiment of a computer system 1201 that may be used with the electronic monitoring device in accordance with the present invention. For example, the Computer System 1201 may be used as part of the tool controls 26 to transfer data and/or instructions to the electronic monitoring device to facilitate any or all of the functions of the electronic monitoring device described above. While the monitoring device processor 18 and monitoring device memory 14 are separate and remote from the Computer System 1201, the processor 18 and memory 14 are typically conceptually part of the system 1201. Therefore, the variations in processor and memory configurations described below apply to the monitoring device 10 as well as the Computer System 1201. The computer system 1201 includes a bus 1202 or other communication mechanism for communicating information, and a internal processor 1203 coupled with the bus 1202 for processing the information. The computer system 1201 includes a memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by the internal processor 1203. In addition, the memory 1204 may be used for storing temporary variables or other intermediate information during the execution of instructions by the internal processor 1203. The computer system 1201 preferably includes a non-volatile memory such as for example a read only memory (ROM) 1205 or other static storage device (e.g., programmable ROM (PROM), erasable PROM (EPROM), and electrically erasable PROM (EEPROM)) coupled to the bus 1202 for storing static information and instructions for the internal processor 1203.

The computer system 1201 may include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer system 1201 can perform a portion of the processing steps of the invention in response to the internal processor 1203 executing one or more sequences of one or more instructions contained in a memory, such as the main memory 1204. Such instructions may be read into the main memory 1204 from another computer readable medium, such as a hard disk 1207 or a removable media drive 1208. Such capability being compatible mostly with the embodiment in which the electronic monitoring device is outside the semiconductor processing system 12. One or more processors in a multi-processing arrangement may also be employed to execute the sequences of instructions contained in main memory 1204. In alternative embodiments, hardwired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media suitable for the present invention are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1201, for driving a device or devices for implementing the invention, and for enabling the computer system 1201 to interact with a human user (e.g., to interact with consumable part disposal personnel). Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the internal processor 1203 or processor 18 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to internal processor 1203 for execution. For example, the instructions may initially be carried on a magnetic disk of a remote computer. The remote computer such as for example the tool controller 26 can load the instructions for implementing all or a portion of the present invention remotely into a dynamic memory and send the instructions to the electronic monitoring device 10. An infrared detector coupled to the bus 1202 can receive the data carried in the infrared signal and place the data on the bus 1202. The bus 1202 carries the data to the main memory 1204, from which the internal processor 1203 retrieves and executes the instructions. The instructions received by the main memory 1204 may optionally be stored on storage device 1207 or 1208 either before or after execution by the internal processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical layer (e.g., CAT 5 cable, coaxial cable, optical fiber, etc). The signals through the various networks and the signals on the network link 1214 and through the communication interface 1213, which carry the digital data to and from the computer system 1201 maybe implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214, and the communication interface 1213. Moreover, the network link 1214 may provide a connection through a LAN 1215 to a mobile device 1217 such as a personal digital assistant (PDA) laptop computer, or cellular telephone.

Numerous modifications and variations of the present invention are possible in light of the above teachings. It is therefore to be understood that within the scope of the appended claims, the invention may be practiced otherwise than as specifically described herein.

What is claimed is:

1. A system for facilitating safe disposal of a consumable part inside a semiconductor processing tool, comprising:
   a process chamber having said consumable part therein;
   an electronic monitoring device dedicated to said consumable part and comprising:
      a memory unit configured to store a history of said chemical exposures of said consumable part within said process chamber;
      a processor connected to the memory unit and configured to communicate with said memory unit to store said history; and
   a power supply circuit connected to the memory unit and the processor, and configured to transfer power to the memory unit and the processor.

2. The system of claim 1, further comprising:
   a gas sensor configured to sense a gaseous environment that the consumable part is exposed to.

3. The system of claim 1, further comprising:
   a chip package including said memory unit, said power supply circuit, and said processor; and
   said chip package attached to said consumable part.

4. The system of claim 1, further comprising:
   a chip package including said memory unit, said power supply circuit, and said processor; and
   said chip package embedded in said consumable part.

5. The system of claim 1, further comprising:
   a chip package including said memory unit, said power supply circuit, and said processor; and
   said chip package detached from said consumable part.

6. The system of claim 1, further comprising:
   a chip package including said memory unit, said power supply circuit, and said processor; and
   said chip package disposed outside the semiconductor processing tool.

7. The system of claim 1, wherein said chip package includes an identification number associated with the consumable part that the electronic device is dedicated to.

8. The system of claim 1, wherein said processor is configured to wirelessly communicate data from and to the memory unit of the electronic monitoring device.

9. The system of claim 1, wherein said processor is configured to communicate said history upon password confirmation.

10. The system of claim 1, further comprising a semiconductor processing tool controller wherein said processor is configured to communicate with the semiconductor processing tool controller, to download semiconductor processing data from the semiconductor processing tool controller, and to store selected parts of said semiconductor processing data in the memory unit as said history of said chemical exposures of said consumable part.

11. The system of claim 10, wherein said processor is configured to communicate as said semiconductor processing data at least one of process run data and gas sensor data.

12. The system of claim 1, wherein said memory unit comprises a non-volatile memory.

13. The system of claim 1, further comprising:
   a battery configured to supply power to said power supply circuit for operation of said memory unit and said processor.

14. The system of claim 13, wherein said battery comprises a rechargeable battery.

15. The system of claim 14, further comprising:
   an rf antenna configured to receive rf energy from an rf field within the semiconductor plasma processing tool;
   a power converter configured to convert said rf energy into dc power; and
   said rechargeable battery configured to be recharged from said dc power.

16. The system of claim 1, further comprising:
   an rf antenna configured to receive rf energy from an rf field within the semiconductor plasma processing tool; and
   a power converter configured to convert said rf energy into dc power for operation of said memory and said processor.

17. The system of claim 1, further comprising:
   a connection port connected to at least one of said processor, said power supply circuit, and said memory unit.

18. The system of claim 17, wherein said connection port is configured to supply power to said power supply circuit for operation of said memory unit and said processor.

19. The system of claim 17, wherein said connection port is configured to communicate to said memory unit.

20. The system of claim 1, further comprising:
   a gas sensor connected to said power supply circuit, said processor, and said memory unit.

21. A method for facilitating disposal of a consumable part from a semiconductor processing tool, comprising:
   acquiring data associated with chemical exposures of the consumable part while inside the semiconductor processing tool;
   storing in a memory unit dedicated to the consumable part as said data a history of said chemical exposures of said consumable part;
   reading said history of said chemical exposures to identify from said history toxins that the consumable part was exposed to while inside the semiconductor processing tool; and
   disposing of said consumable part based on the toxins identified from said history.

22. The method of claim 21, wherein the step of acquiring data comprises:
acquiring said data from a gas sensor configured to sense the gaseous environment about the consumable part.

23. The method of claim 22, wherein the step of acquiring data comprises:
acquiring said data from said gas sensor attached to said consumable part.

24. The method of claim 22, wherein the step of acquiring data comprises:
acquiring said data from said gas sensor connected to said semiconductor processing tool.

25. The method of claim 24, wherein the step of acquiring data comprises:
transmitting at least one of gas sensor data and process run data from said semiconductor processing tool to said memory unit dedicated to the consumable part.

26. The method of claim 25, wherein the step of transmitting transmits said data from said gas sensor connected to said semiconductor processing tool wirelessly to said memory unit dedicated to the consumable part.

27. The method of claim 25, wherein the step of transmitting transmits said data from said gas sensor connected to said semiconductor processing tool by wire to said memory unit dedicated to the consumable part.

28. The method of claim 21, wherein the step of acquiring data comprises:
acquiring process run data from said semiconductor processing tool; and
discriminating and removing process proprietary data from said process run data such that non-confidential data is stored as said history of said chemical exposures.

29. The method of claim 21, wherein the step of storing said data comprises:
storing said data in a non-volatile memory unit.

30. The method of claim 21, wherein the step of reading said history comprises:
reading said history from said memory unit after password confirmation.

31. The method of claim 21, wherein the step of reading said history comprises:
transmitting said history from said memory unit wirelessly to a recipient.

32. The method of claim 21, wherein the step of reading said history comprises:
transmitting said history from said memory unit by wire to a recipient.

33. The method of claim 21, wherein the step of reading said history comprises:
identifying exposure levels to said toxins.

34. The method of claim 21, wherein the step of disposing of said consumable part comprises:
selecting a disposal technique based on a primary toxin that said consumable part was exposed to.

* * * * *